US012157585B2

(12) United States Patent
Tillotson

(10) Patent No.: US 12,157,585 B2
(45) Date of Patent: Dec. 3, 2024

(54) SYSTEMS AND METHODS FOR POINTING PHOTOVOLTAIC ARRAYS

(71) Applicant: Blue Origin, LLC, Kent, WA (US)

(72) Inventor: Brian Jay Tillotson, Kent, WA (US)

(73) Assignee: Blue Origin, LLC, Kent, WA (US)

(*) Notice: Subject to any disclaimer, the term of this patent is extended or adjusted under 35 U.S.C. 154(b) by 531 days.

(21) Appl. No.: 17/560,798

(22) Filed: Dec. 23, 2021

(65) Prior Publication Data
US 2023/0202684 A1 Jun. 29, 2023

(51) Int. Cl.
*B64G 1/36* (2006.01)
*B64G 1/44* (2006.01)
*G01J 1/42* (2006.01)
*G01S 3/786* (2006.01)
*H02S 20/32* (2014.01)

(52) U.S. Cl.
CPC ............... *B64G 1/36* (2013.01); *B64G 1/363* (2013.01); *B64G 1/443* (2013.01); *G01J 1/42* (2013.01); *G01S 3/7861* (2013.01); *H02S 20/32* (2014.12); *G01J 2001/4266* (2013.01)

(58) Field of Classification Search
CPC .......... B64G 1/36; B64G 1/363; B64G 1/443; B64G 1/244; B64G 1/361; B64G 1/365; B64G 1/44; G01J 1/42; G01J 2001/4266; G01J 1/0228; G01J 1/0266; G01S 3/7861; H02S 20/32; H02S 20/30; H01L 31/0543
See application file for complete search history.

(56) References Cited

U.S. PATENT DOCUMENTS 6,293,502 B1 * 9/2001 Fowell ............... B64G 1/244 244/164
6,550,721 B2 * 4/2003 Williams ............ B64G 1/283 244/164

(Continued)

FOREIGN PATENT DOCUMENTS

CN 103274060 B 4/2015
JP 2004196052 A 7/2004

(Continued)

OTHER PUBLICATIONS

Delleur et al., "Electrical Performance of the International Space Station U.S. Photovoltaic Array During Bifacial Illumination", Technical Memorandum 20020061365, Publication Date: Jul. 1, 2002.

(Continued)

*Primary Examiner* — Seung C Sohn
(74) *Attorney, Agent, or Firm* — KNOBBE, MARTENS, OLSON & BEAR, LLP

(57) ABSTRACT

Systems and methods for pointing photovoltaic arrays for optimal power generation. One or more methods among a plurality of methods for pointing an array may be used by a spacecraft control system to point the array. Example methods to use to point the photovoltaic array relate to analyzing current output, analyzing image data, and analyzing computational knowledge of reflective bodies or light sources. The spacecraft may be further controlled to reduce shadow by re-orienting, receiving light reflected off spacecraft, and orienting a photovoltaic array relative to incoming light sources based on topographic properties of the array such as cell grooves.

30 Claims, 9 Drawing Sheets

(56) References Cited

U.S. PATENT DOCUMENTS 8,180,505 B2 5/2012 Simburger et al.
2009/0242012 A1 10/2009 Kare

FOREIGN PATENT DOCUMENTS

| RU | 2325312 C2 | 5/2008 |
| RU | 2340518 C2 | 12/2008 |
| RU | 2544021 C2 | 3/2015 |
| RU | 2562904 C1 | 9/2015 |
| RU | 2578416 C1 | 3/2016 |
| RU | 2653890 C2 | 5/2018 |

OTHER PUBLICATIONS

Fontana, "The Effect of Planetary Albedo on Solar Orientation of Spacecraft", NASA Technical Note 19670026393, Publication Date: Sep. 1, 1967.

Girish et al., "Photovoltaic Power Generation Using Albedo and Thermal Radiations in the Satellite Orbits Around Planetary Bodies", Solar Energy Materials and Solar Cells 91(15-16): 1503-1504, Energy Materials and Solar Cells 91(15-16): 1503-1504, Publication Date: Apr. 30, 2007; DOI: https://doi.org/10.1016/j.solmat.2007.03.013.

* cited by examiner

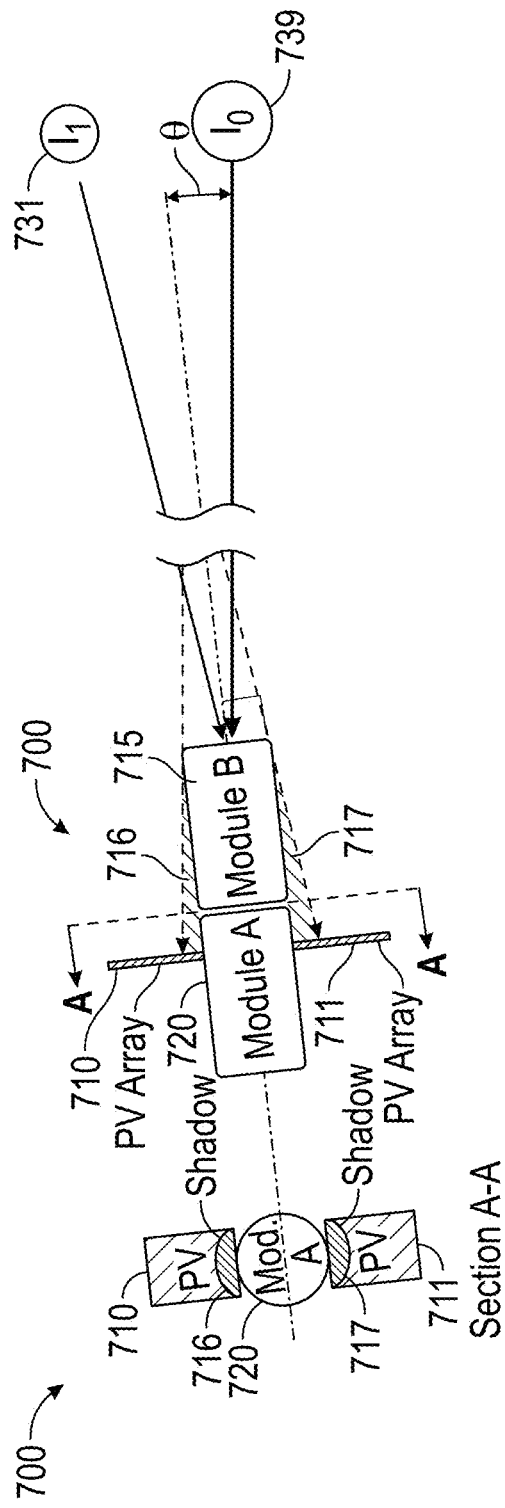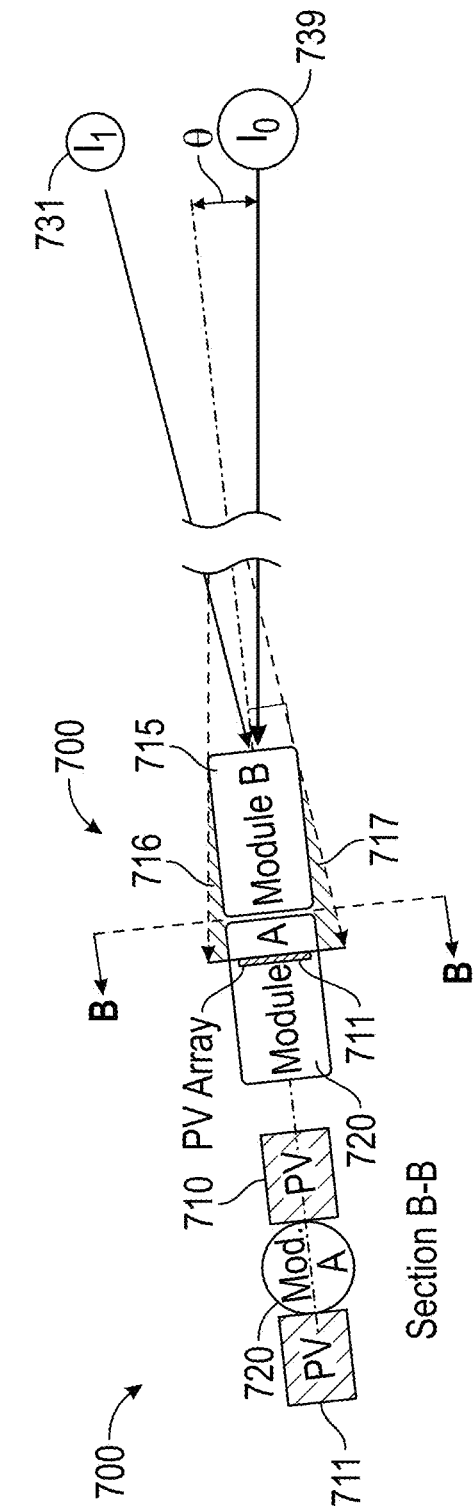

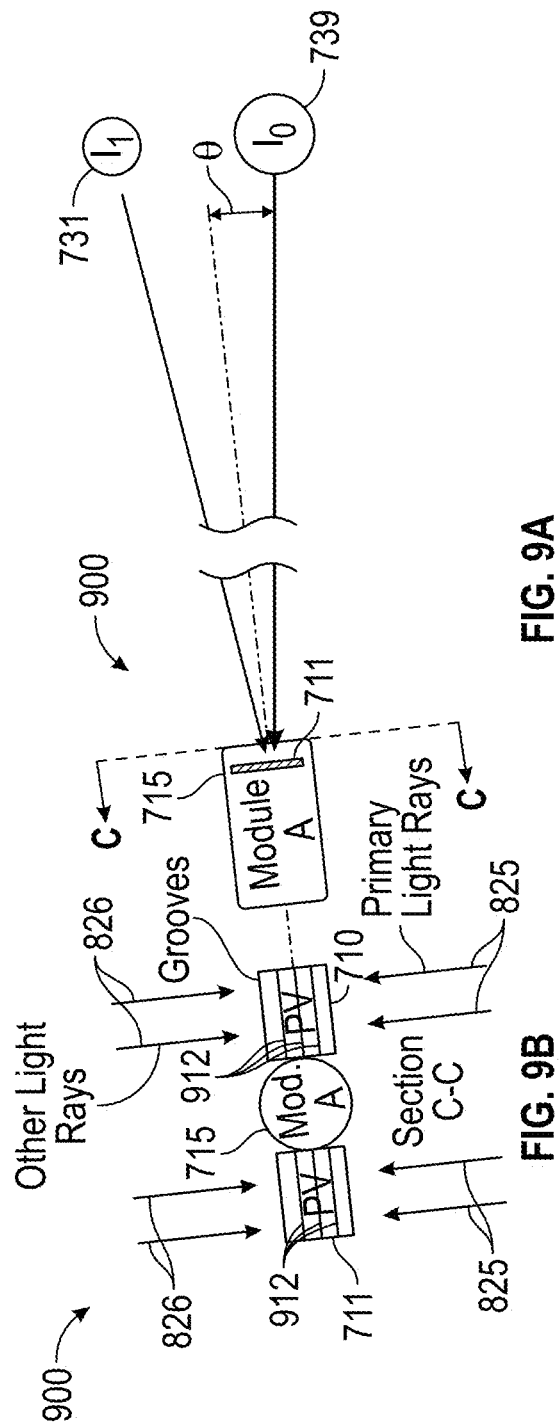
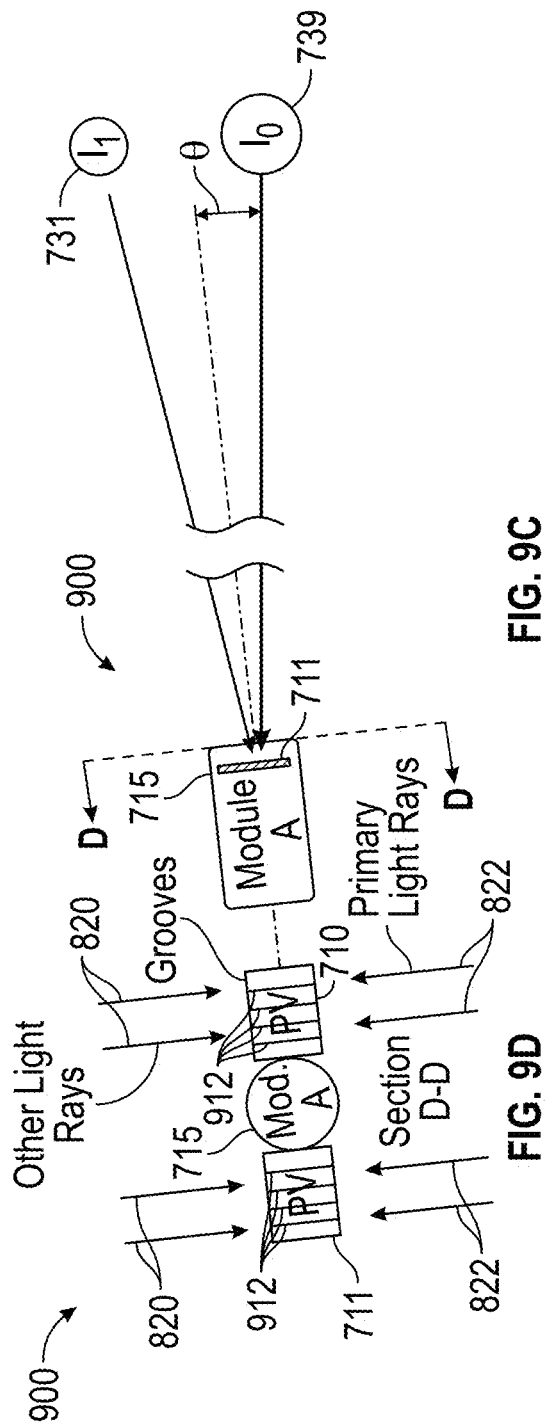

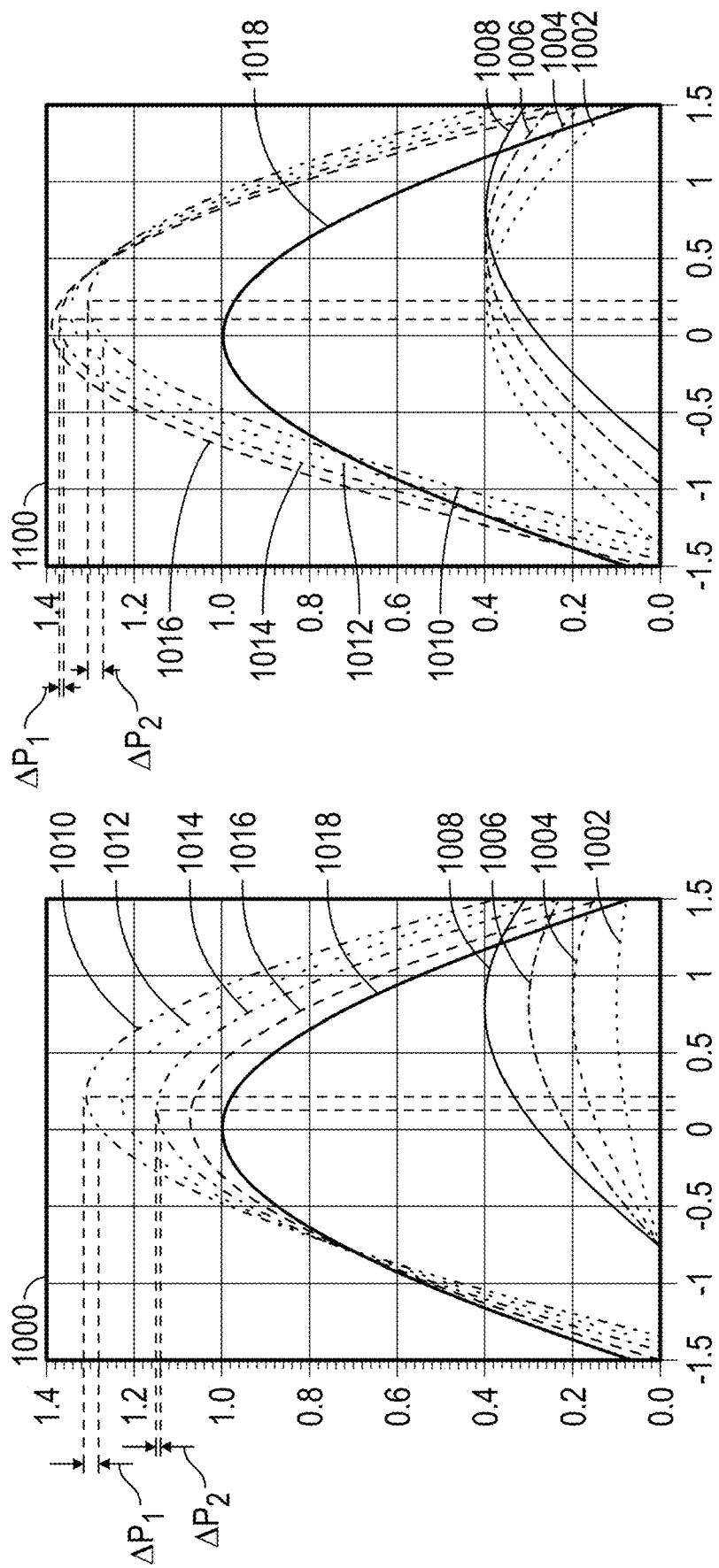

SYSTEMS AND METHODS FOR POINTING PHOTOVOLTAIC ARRAYS

BACKGROUND

Field

The technology relates generally to photovoltaics, in particular to systems and methods for pointing spacecraft photovoltaic arrays.

Description of the Related Art

Solar or photovoltaic arrays convert solar energy into electrical power. Such arrays are used on spacecraft to provide power to the spacecraft subsystems. Sunlight must be incident upon solar cells of the array to collect the solar energy. Pointing of the arrays is therefore important. Existing solutions are deficient in generating the maximum amount of power based on pointing. There is therefore a need for improvements to these and other drawbacks of existing solutions for pointing spacecraft photovoltaics.

SUMMARY

The embodiments disclosed herein each have several aspects no single one of which is solely responsible for the disclosure's desirable attributes. Without limiting the scope of this disclosure, its more prominent features will now be briefly discussed. After considering this discussion, and particularly after reading the section entitled "Detailed Description" one will understand how the features of the embodiments described herein provide advantages over existing approaches to spacecraft photovoltaics.

Described herein are systems and devices for pointing spacecraft photovoltaic arrays. A method among a plurality of methods may be selected to use to point the photovoltaic array. The method may be selected based on analysis of one or more solar power parameters. Example solar power parameters include an orbital position of the spacecraft, an attitude of the spacecraft, a position of one or more celestial bodies, visibility of the sun, visibility of the one or more reflective bodies, light reflectivity of one or more reflective bodies, and an orientation of grooves between solar cells in the photovoltaic array. Example methods to use to point the photovoltaic array include analyzing photovoltaic array current output, analyzing image data related to light sources, and analyzing computational knowledge of reflective bodies such as location and weather conditions. The spacecraft and/or array may be further controlled to reduce shadow by re-orienting the spacecraft and/or array, positioning the array to receive light reflected off spacecraft, and/or orienting the photovoltaic array relative to incoming light sources based on topographic properties of the array such as cell grooves.

In one aspect, a control system for pointing a photovoltaic array on a spacecraft includes a processor and a memory storing instructions thereon that, when executed by the processor, cause the control system to point the photovoltaic array using one or more methods of a plurality of methods for pointing the photovoltaic array, where the plurality of methods includes a first method comprising analyzing first data related to electrical output from the photovoltaic array, a second method comprising analyzing second data related to one or more light sources, and a third method comprising analyzing third data related to computational knowledge of one or more reflective bodies; and orient the photovoltaic array such that grooves of solar cells of the photovoltaic array are parallel to a plane of incoming light.

Various embodiments of the above and other aspects may be implemented. The instructions may further cause the control system to orient the photovoltaic array based on analysis of electrical output of the solar array. The instructions may further cause the control system to orient the photovoltaic array based on analysis of brightness of the one or more light sources. The instructions may further cause the control system to orient the photovoltaic array based on analysis of locations of one or more light sources. The instructions may further cause the control system to determine an orbital position of the spacecraft is located in a path of light reflected from a reflective body. The instructions may further cause the control system to determine the attitude of the spacecraft is such that light is being reflected off the spacecraft in a manner such that the photovoltaic array is configured to be pointed to receive the reflected light. The instructions may further cause the control system to determine the attitude of the spacecraft is such that light is incoming along a path such that the photovoltaic array is not pointed to receive all of the incoming light as a result of shadowing. The instructions may further cause the control system to determine whether a sun and/or another celestial body is within a line of sight of the photovoltaic array. The instructions may further cause the control system to analyze a brightness of incoming light received at an imaging sensor on the spacecraft. The instructions may further cause the control system to point the photovoltaic array in between a sun and a reflective celestial body using the first method, where the first data comprises electrical power output from the photovoltaic array based on angle of pointing the array. The instructions may further cause the control system to point the photovoltaic array in between a sun and a reflective celestial body using the second method, where the second data comprises brightness of the one or more light sources. The instructions may further cause the control system to point the photovoltaic array in between a sun and a reflective celestial body using the third method, where the third data comprises locations of one or more light sources. The control system may further comprise a light sensor and/or an imaging sensor.

In another aspect, a spacecraft comprises a photovoltaic array and a control system for pointing the photovoltaic array. The control system comprises a processor and a memory storing instructions thereon that, when executed by the processor, cause the control system to point the photovoltaic array using one or more methods of a plurality of methods for pointing the photovoltaic array, where the plurality of methods includes a first method comprising analyzing first data related to electrical output from the photovoltaic array, a second method comprising analyzing second data related to one or more light sources, and a third method comprising analyzing third data related to computational knowledge of one or more reflective bodies; and orient the photovoltaic array such that grooves of solar cells of the photovoltaic array are parallel to a plane of incoming light.

Various embodiments of the above and other aspects may be implemented. The instructions may further cause the control system to orient the photovoltaic array based on analysis of electrical output of the solar array. The instructions may further cause the control system to orient the photovoltaic array based on analysis of brightness of the one or more light sources. The instructions may further cause the control system to orient the photovoltaic array based on analysis of locations of one or more light sources. The instructions may further cause the control system to do one or more of the following: determine the orbital position of the spacecraft is located in a path of light reflected from a reflective body, determine the attitude of the spacecraft is such that light is being reflected off the spacecraft in a manner such that the photovoltaic array is configured to be pointed to receive the reflected light, determine the attitude of the spacecraft is such that light is incoming along a path such that the photovoltaic array is not pointed to receive all of the incoming light as a result of shadowing, determine whether the sun and/or another celestial body is within a line of sight of the photovoltaic array, and analyze a brightness of incoming light received at an imaging sensor on the spacecraft. The instructions may further cause the control system to point the photovoltaic array in between a sun and a reflective celestial body using the first method, where the first data comprises electrical power output from the photovoltaic array based on angle of pointing the array. The instructions may further cause the control system to point the photovoltaic array in between a sun and a reflective celestial body using the second method, where the second data comprises brightness of the one or more light sources. The instructions may further cause the control system to point the photovoltaic array in between a sun and a reflective celestial body using the third method, where the third data comprises locations of one or more light sources. The spacecraft may further comprise a light sensor and/or an imaging sensor.

In another aspect, a method for pointing a photovoltaic array on a spacecraft comprises pointing the photovoltaic array using one or more methods of a plurality of methods for pointing the photovoltaic array, where the plurality of methods includes a first method comprising analyzing first data related to electrical output from the photovoltaic array, a second method comprising analyzing second data related to one or more light sources, and a third method comprising analyzing third data related to computational knowledge of one or more reflective bodies. The method further comprises orienting the photovoltaic array such that grooves of solar cells of the photovoltaic array are parallel to a plane of incoming light.

Various embodiments of the above and other aspects may be implemented. The method may further comprise analyzing electrical output of the solar array, and orienting the photovoltaic array based on analyzing the electrical output of the solar array. The method may further comprise analyzing brightness of the one or more light sources, and orienting the photovoltaic array based on analyzing the brightness of the one or more light sources. The method may further comprise analyzing locations of one or more light sources, and orienting the photovoltaic array based on analyzing the locations of the one or more light sources. The method may further comprise pointing the photovoltaic array in between a sun and a reflective celestial body using the first method, where the first data comprises electrical power output from the photovoltaic array based on angle of pointing the array. The method may further comprise pointing the photovoltaic array in between a sun and a reflective celestial body using the second method, where the second data comprises brightness of the one or more light sources. The method may further comprise pointing the photovoltaic array in between a sun and a reflective celestial body using the third method, where the third data comprises locations of one or more light sources. The method may further comprise one or more of the following: determining the orbital position of the spacecraft is located in a path of light reflected from a reflective body, determining the attitude of the spacecraft is such that light is being reflected off the spacecraft in a manner such that the photovoltaic array is configured to be pointed to receive the reflected light, determining the attitude of the spacecraft is such that light is incoming along a path such that the photovoltaic array is not pointed to receive all of the incoming light as a result of shadowing, determining whether the sun and/or another celestial body is within a line of sight of the photovoltaic array, and analyzing a brightness of incoming light received at an imaging sensor on the spacecraft.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are not to be considered limiting of its scope, the disclosure will be described with additional specificity and detail through use of the accompanying drawings.

FIGS. 7A-7D are various views of a schematic of a spacecraft shown in various orientations to reduce shadow on the photovoltaic array.

FIGS. 9A-9D are various views of a schematic of a spacecraft with a photovoltaic array having grooves in various orientations relative to incoming light.

FIGS. 10A and 10B are data plots showing an example range of pointing angles that provide higher power generation relative to direct pointing at a primary light source, for various levels of, respectively, irradiance level and angle of incidence of one or more secondary light sources.

DETAILED DESCRIPTION

Figure 1:
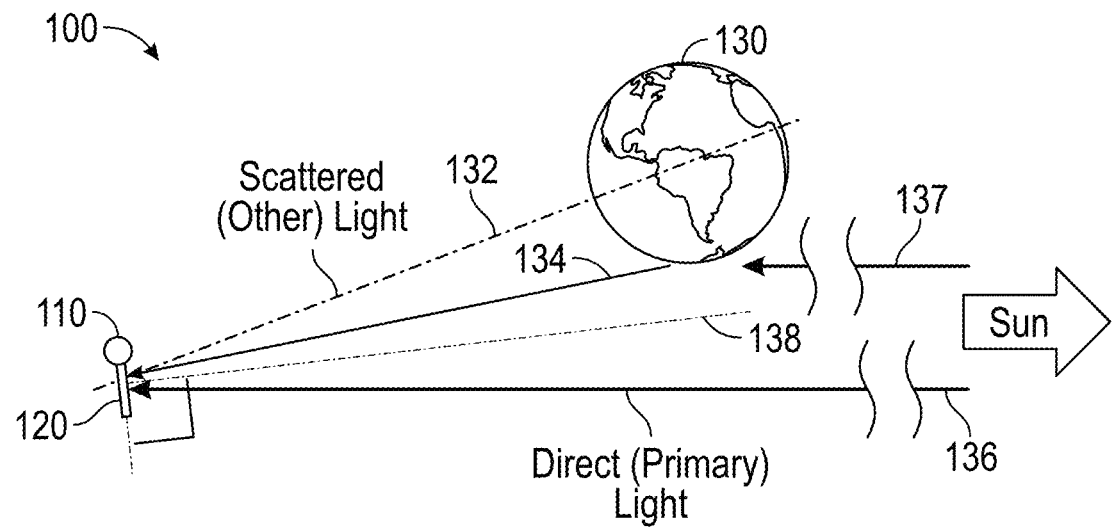
FIG. 1 is a schematic of a spacecraft pointing a photovoltaic array between multiple light sources for optimal solar power generation.

In the following detailed description, reference is made to the accompanying drawings, which form a part hereof. In the drawings, similar symbols typically identify similar components, unless context dictates otherwise. In some drawings, various structures according to embodiments of the present disclosure are schematically shown. However, the drawings are not necessarily drawn to scale, and some features may be enlarged while some features may be omitted for the sake of clarity. It will be readily understood that the aspects of the present disclosure, as generally described herein, and illustrated in the figures, can be arranged, substituted, combined, and designed in a wide variety of different configurations, all of which are explicitly contemplated and make part of this disclosure. The illustrative embodiments described in the detailed description, drawings, and claims are not meant to be limiting. Other embodiments may be utilized, and other changes may be made, without departing from the spirit or scope of the subject matter presented here.

The following detailed description is thus directed to certain specific embodiments of the development. Reference in this specification to "one embodiment," "an embodiment," or "in some embodiments" means that a particular feature, structure, or characteristic described in connection with the embodiment is included in at least one embodiment of the present disclosure. The appearances of the phrases "one embodiment," "an embodiment," or "in some embodiments" in various places in the specification are not necessarily all referring to the same embodiment, nor are separate or alternative embodiments necessarily mutually exclusive of other embodiments. Moreover, various features are described which may be exhibited by some embodiments and not by others. Embodiments of the development may include several novel features, no single one of which is solely responsible for its desirable attributes or which is essential to practicing the present disclosure.

A. Example Photovoltaic Array Pointing Schematics

FIG. 1 is a schematic of a spacecraft 110 having a solar or photovoltaic array 120 pointed between multiple light sources. The light sources are the sun and sunlight reflected off Earth 130. Light from the sun travels along the directions 136 and 137. Direct light impinges on the photovoltaic array 120 in the direction 136. The light from the sun in the direction 137 reflects off the Earth 130 in the reflected direction 134 toward the spacecraft 110. The center of Earth is in the direction 132 from the spacecraft 110. The spacecraft 110 points the photovoltaic array 120 in the direction 138 in order to optimize the generation of electric power from the various incoming light sources. The direction 138 is in between the directions 136 and 134. The angle between the directions 134 and 138 and the angle between the directions 136 and 138 are not necessarily equal angles, as further described with respect to FIGS. 2A and 2B. By pointing the photovoltaic array 120 in the direction 138, more power is generated than if the photovoltaic array 120 was pointed directly at the sun along the line 136. "Pointing" in a particular direction as used herein means the light-collecting solar cell surface, approximated as a plane, of the photovoltaic array 120 is perpendicular to that direction. For example, as indicated in FIG. 1, the photovoltaic array 120 is at a right angle to the direction 138.

In FIG. 1, the size of the spacecraft 110 is exaggerated for clarity, but the size of Earth and distance to Earth are roughly to scale for the spacecraft's 110 position at equatorial geostationary orbit (GEO). The arrival angle of sunlight at Earth shown is typical for December-January. The photovoltaic array is thus pointed between the sun and Earth 130.

Figure 2A:
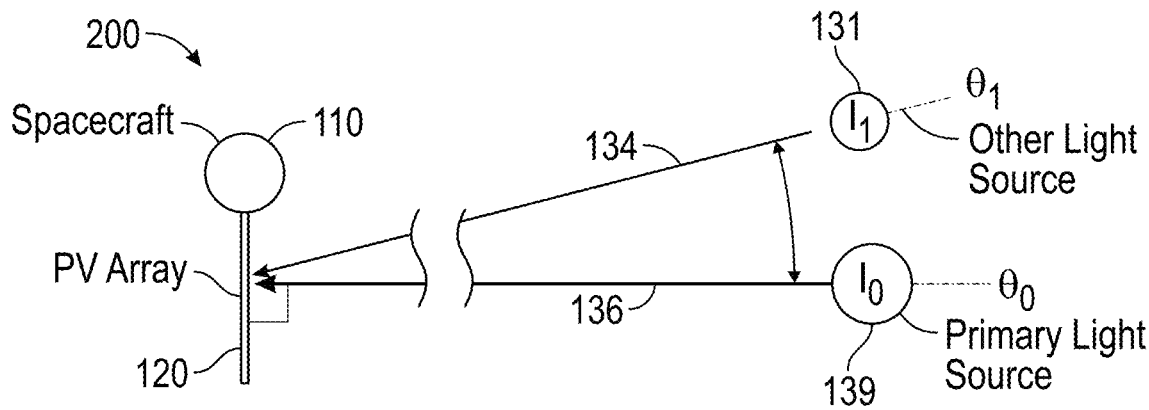
FIGS. 2A and 2B are schematics illustrating a spacecraft pointed, respectively, directly at a primary light source and in between the primary light source and a secondary light source.
Figure 2B:
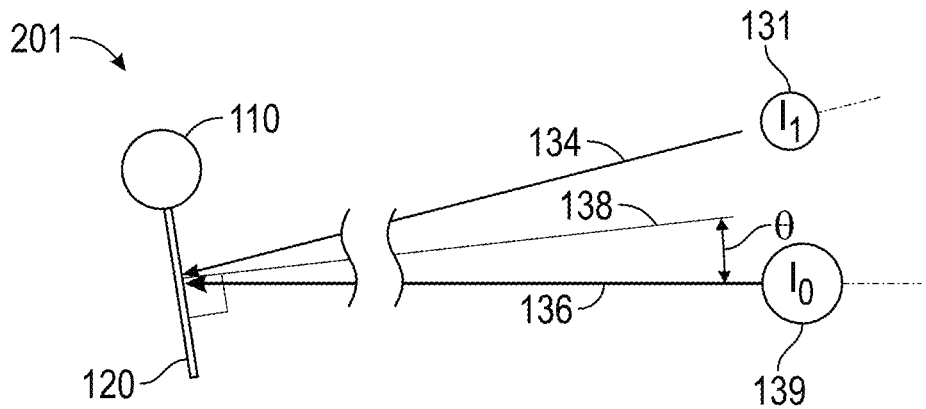

FIGS. 2A and 2B further illustrate the aspect of pointing the photovoltaic array 120 in an optimal direction between multiple light sources, using two light sources for the sake of example. The systems and methods described herein improve performance of the photovoltaic array 120. When the spacecraft 110 has a view of the sun and a view of another light source, e.g., the sunlit earth or a nearby spacecraft, the spacecraft aims the photovoltaic array 120 in a direction between the sun and the other light source. The particular aiming direction is chosen to exploit light from both sources, producing more electric power than if the array were aimed directly at one of the sources.

FIG. 2A is a schematic 200 illustrating the photovoltaic array 120 pointed directly at a primary light source 139. FIG. 2B is a schematic 201 illustrating the photovoltaic array 120 pointed between the primary light source 139 and another light source 131. The primary light source 139 may be the sun, or it could be other light sources, such as lasers. The secondary light source 131 may be light reflected of a planet or other celestial body such as the moon, light generated by a secondary source such as a laser or a source on a planet, or light reflected off another portion of the spacecraft 110 or off another spacecraft. Light from the primary light source 139 travels along the direction 136 and at a reference angle $\theta_0$ while light from the secondary light source 131 travels along the direction 134 at a reference angle $\theta_1$ relative to angle $\theta_0$. The spacecraft 120 in FIG. 2B is pointing the photovoltaic array 120 in the direction 138 at a reference angle $\theta$ that is in between $\theta_0$ and $\theta_1$. By "in between," and as used generally herein, it is meant that $\theta$ is greater than $\theta_0$ and less than $\theta_1$. Thus the angle $\theta$ may be any value between the two reference angles $\theta_0$ and $\theta_1$.

B. Example Data Plot and Calculations Showing Increased Power

Figure 3:
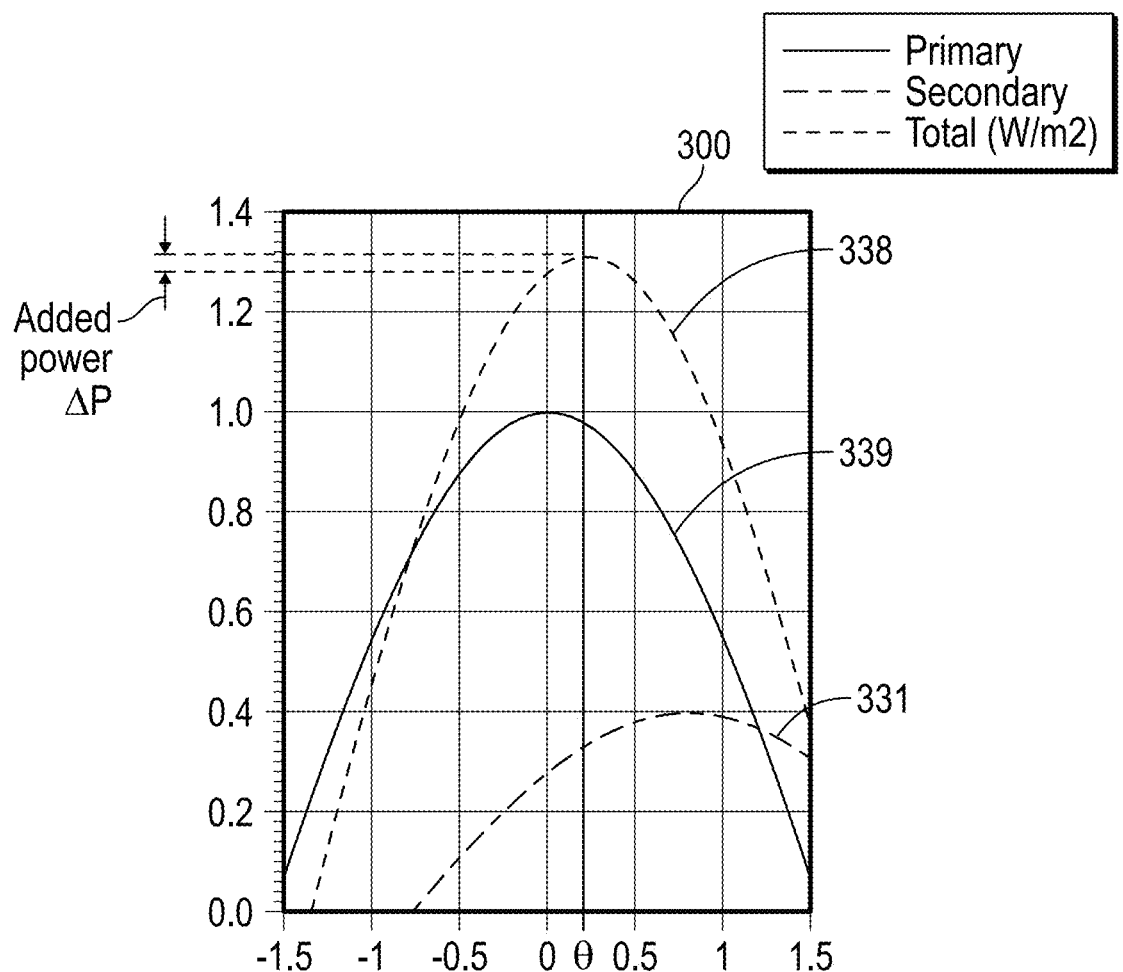
FIG. 3 is a data plot showing an example of the resulting solar power generated by pointing the photovoltaic array in the directions indicated in FIGS. 2A and 2B.

FIG. 3 is a data plot 300 showing example resulting solar power generated by the various pointing directions of FIGS. 2A and 2B. The horizontal axis is the angular orientation of the photovoltaic array in radians. The vertical axis is power expressed in dimensionless units as a ratio of the power available from pointing directly at the primary light source, which is standardized at "1.0" in this example. Thus the data line 339 corresponds to the power output by pointing the photovoltaic array 120 directly at the primary light source 139 along the direction 136 at the angle $\theta_0$, as shown in FIG. 2A. The maximum value of the data line 339 is 1.0. The data line 331 corresponds to the power output by pointing the photovoltaic array 120 directly at the secondary light source 131 along the direction 134 at the angle $\theta_1$. The maximum value of the data line 331 is 0.4. The data line 338 corresponds to the power output by pointing the photovoltaic array 120 in between the primary light source 139 and the secondary light source 131 along the direction 138 at the angle $\theta$, as shown in FIG. 2B. The maximum value of the data line 338 is about 1.3.

As shown in FIG. 3, there are a range of angles in which the photovoltaic array may be pointed to generate more power relative to pointing directly at the primary light source. For instance, pointing the photovoltaic array at angles greater than about −0.5 radians and less than about 0.9 radians will produce more power relative to pointing directly at the primary light source. Further, the angle θ, which is within this range, produces the maximum amount of power. This angle may be found analytically. For example, for a flat photovoltaic array, power $P_0$ from a primary light source is:

$$P_0 = AI_0 \cos(\theta - \theta_0), \quad (1)$$

where A is the surface area of the light-collecting cells of the photovoltaic array, and $I_0$ is the intensity of light from the primary light source. Power $P_1$ from the secondary source is:

$$P_1 = AI_1 \cos(\theta - \theta_1), \quad (2)$$

where $I_1$ is the intensity of light from the secondary light source. Total power is therefore:

$$P_T = P_0 + P_1 = AI_0 \cos(\theta - \theta_0) + AI_1 \cos(\theta - \theta_1). \quad (3)$$

The photovoltaic array is oriented to give maximum power when the angle $\theta = \theta_{max}$ that satisfies the following, which takes the first derivative of the total power $P_T$ with respect to the angle θ:

$$dP_T/d\theta = -A[I_0 \sin(\theta_{max} - \theta_0) + I_1 \sin(\theta_{max} - \theta_1)] = 0. \quad (4)$$

This occurs at the flat point or maximum of the data line 338 in FIG. 3, where power is about 2.7% higher than at θ=0. The value of θ for maximum power may be solved graphically, as shown in FIG. 3 by the vertical line intersecting the data line 338 at the peak total power. It may also be solved numerically. For small θ, where sin(θ)~ θ, the value of θ can be solved analytically: the derivative=0 at $\theta = \theta_{max}$ such that:

$$\theta_{max} = I_1(\theta_1 - \theta_0)/(I_1 - I_0). \quad (5)$$

In other applications, typical secondary sources are the moon or a sunlit section of the spacecraft. Further, some applications have more than two light sources. In those cases, orienting the photovoltaic array is a 2D optimization (azimuth and elevation, for example) rather than 1D (an angle between two light sources). Likewise, in some applications, at least one light source may subtend a large angle so a point-source approximation is invalid. In those cases, the systems and methods described herein may use a numerical approximation treating the large-angle source as many point sources and applying equation (4) above. An example of a large-angle source is light scattered from Antarctica to a satellite in low polar orbit. Snow and clouds scatter more than 40% of sunlight, so efficiently capturing that light adds a significant amount of power.

C. Example Control System

Figure 4:
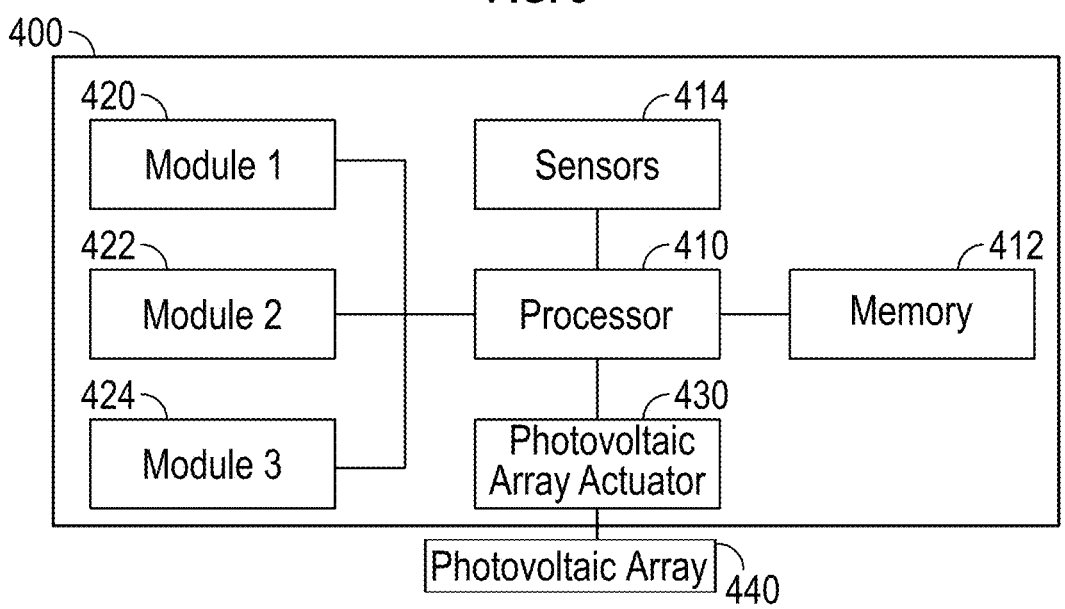
FIG. 4 is a schematic of an embodiment of a control system that may be used to perform the various methods described herein for optimizing solar power from a photovoltaic array.

FIG. 4 is a schematic of an embodiment of a control system 400 that may be used to perform the various methods described herein for optimizing solar power from a photovoltaic array 440, which may be the photovoltaic array 120. The control system 400 includes a processor 410 connected to one or more sensors 414. The sensors may be light sensors, imaging sensors, horizon sensors, star trackers, inertial measurement units (IMU), accelerometers, gyroscopes, magnetometers, radio direction finders, GPS receivers, other suitable sensors, or combinations thereof.

The processor 410 is in communication with a memory 412, which may be long-term storage memory. The processor is in communication with various modules 420, 422, 424. The modules and/or memory may store instructions that when executed by the processor perform the various methods described herein. For example, the module 420 may store instructions for analyzing first data related to electrical output from the photovoltaic array 440. The module 422 may store instructions for analyzing second data related to one or more light sources. The module 424 may store instructions for analyzing third data related to computational knowledge of one or more reflective bodies. There may be fewer than or more than three modules. The modules may perform these and/or other functions. In some embodiments, the memory and/or one or more modules may store instructions for analyzing one or more solar parameters or for pointing the photovoltaic array 440.

The processor 410 may be in communication with a photovoltaic array actuator 430, which may be commanded by the control system 400 to move or point the photovoltaic array 440 in a particular direction. The photovoltaic array actuator 430 is in mechanical and/or electrical communication with the photovoltaic array 440. The photovoltaic array actuator 430 may be a motor, gimbal, or other device configured to move the photovoltaic array 440 relative to the spacecraft. In some embodiments, the actuator 430 may be a thruster, control moment gyro, or other device configured to rotate the entire spacecraft 110 or portions thereof to thereby point the photovoltaic array 440 in a particular direction. Thus the control system 400 may be part of a spacecraft, such as the spacecraft 110 of FIG. 1, where the spacecraft is commanded to rotate by the control system 400.

In some embodiments, the spacecraft 110 includes the control system 400 for pointing the photovoltaic array 440 or 120. The control system 400 may comprise the processor 410 and the memory 412 and/or one or more modules 420, 422, 424 storing instructions thereon that, when executed by the processor 410, cause the control system 400 to perform various actions. For example, the control system 400 may analyze one or more solar power parameters. The control system 400 may use one or more of a plurality of methods for pointing the photovoltaic array 440. The plurality of methods may include 1) a first method comprising analyzing first data related to electrical output from the photovoltaic array 440, 2) a second method comprising analyzing second data related to one or more light sources or reflective bodies, and 3) a third method comprising analyzing third data related to computational knowledge of one or more light sources or reflective bodies. The control system 400 may then point the photovoltaic array using the identified method. The control system 400 may further command the spacecraft and/or solar array to reduce shadow by re-orienting the spacecraft and/or array, positioning the array to receive light reflected off spacecraft, and/or orienting the photovoltaic array relative to incoming light sources based on topographic properties of the array such as cell grooves, as further described. These and other features of the various systems, devices and methods for spacecraft photovoltaics are described in further detail herein.

D. Example Methods for Pointing the Photovoltaic Array

Figure 5A:
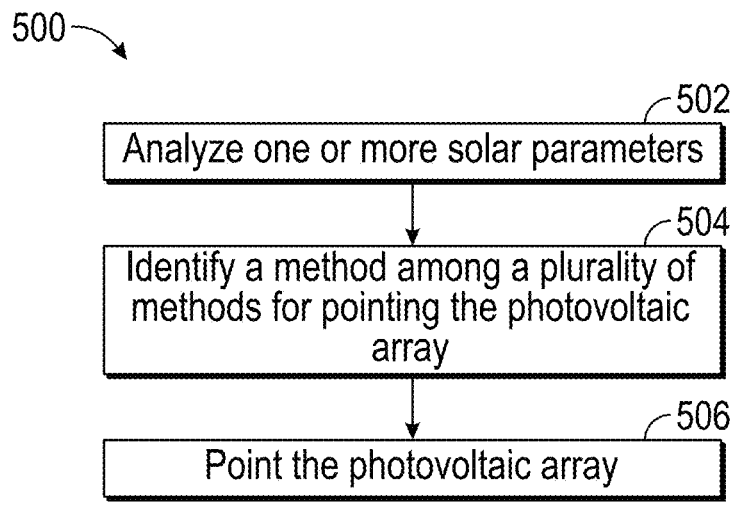
FIG. 5A is a flow chart illustrating an embodiment of a method for selecting among various methods for pointing a photovoltaic array on a spacecraft to optimize power generation.

FIG. 5A is a flow chart illustrating an embodiment of a method 500 for selecting among various methods for pointing the photovoltaic array 120 (or photovoltaic array 440) on the spacecraft 110 to optimize power generation. The control system 400 may be configured to perform one of a variety of methods for pointing the photovoltaic array 120. The control system 400 may further be configured to analyze various data and select which method to use based on this analysis. Thus, multiple approaches to pointing the array may be possible, and the overall method allows for determining which among those particular approaches is optimal or otherwise most suitable, and then implements that particular approach, as further described.

In some embodiments, the control system may be designed by a spacecraft engineer to use a particular method selected from a plurality of methods for optimizing power generation. Such analysis may be done using a processor and non-transitory computer-readable medium, and which may be used prior to launch of the spacecraft. Thus, the method 500 and/or other methods described herein may be performed by software prior to launch. In some embodiments, the method 500 may be performed by the spacecraft on orbit, for example using the control system 400. Therefore, various embodiments of the various methods may be implemented.

The method 500 begins with step 502 wherein one or more solar parameters are analyzed. A computer used by a software engineer to design the control system 400 may analyze the parameters. In some embodiments, the control system 400, such as the processor 410, may analyze the parameters. The one or more solar power parameters may include one or more of the following: an orbital position of the spacecraft 110, an attitude (i.e. three dimensional orientation) of the spacecraft 110, a position of one or more celestial bodies, a visibility of the sun, a visibility of the one or more reflective bodies, a light reflectivity of the one or more reflective bodies, and an orientation of grooves between solar cells in the photovoltaic array 120. In some embodiments of step 502, the instructions executed by the processor 410 may cause the control system 400 to perform various functions, such as those shown in and described with respect to FIG. 6.

The method 500 then moves to step 504, where a method among a plurality of methods for pointing the photovoltaic array 120 (or photovoltaic array 440) is identified. The identification in step 504 may be based on the analysis of the one or more solar power parameters in step 502. The processor used by a software engineer may identify the method for pointing the array. In some embodiments, the control system 400, for example the processor 410, may identify the method for pointing the array based on input from the one or more sensors 414 and/or results of one or more analyses performed based on instructions stored in the memory 412 and/or modules 420, 422, 424.

In step 504, the plurality of methods may include a first method comprising analyzing first data related to electrical output from the photovoltaic array. An example embodiment of this first method is shown in, and described with respect to, FIG. 5B. The plurality of methods may include a second method comprising analyzing second data related to one or more light sources. An example embodiment of this second method is shown in, and described with respect to, FIG. 5C. The plurality of methods may include a third method comprising analyzing third data related to computational knowledge of one or more reflective bodies. An example embodiment of this third method is shown in, and described with respect to, FIG. 5D.

In step 504, the identification of which method to use may be based on the results of analysis of the solar parameters. For example, the computer used by the spacecraft engineer may determine one or more of the following: that the orbital position of the spacecraft 110 is such that the orbit will allow for a threshold amount of time and/or quality of viewing the sun and/or a secondary light source; that the orbit has or will put the spacecraft 110 within an eclipsed position that blocks light from a primary and/or secondary light source; that the attitude of the spacecraft 110 is or will allow for a certain angle or range of angles to be achieved with the photovoltaic array 440 relative to a primary or secondary light source; that a celestial body such as the moon or other planet is or will be in a particular location relative to the spacecraft 110; that the sun and/or a reflective body, such as a moon, planet or other spacecraft, is or will be within a direct line of sight of the spacecraft 110; that the light reflectivity from a reflective body and directed toward the spacecraft 110 is of a certain amount or quality; that the orbital position, attitude, and/or geometry of the spacecraft 110 is such that a particular amount of shadowing on the photovoltaic array 440 by other portions of the spacecraft 110 is or will occur; and/or that grooves in the photovoltaic array 440 are oriented in a particular direction and may be re-oriented such that the grooves may be at a particular angle with respect to incoming light sources. In some embodiments, the control system 400, for instance the processor 410, may determine one or more of the foregoing. These are just some example results that may be used and others may also be included in the analysis performed in step 504.

The results of the various analyses described above may then be assessed to determine which among the various methods to use for pointing the photovoltaic array 440 or 120. For example, the results of step 502 may indicate that the orbital position is or will be such that an optimal pointing angle may be determined based on electrical output to the array, due to favorable positioning along the orbit relative to the primary and secondary light sources. Or, for example, the results of step 502 may indicate that the line of sight and/or intensity of incoming light from multiple sources is or will be such that using one or more sensors, such as imaging sensors, is best to determine how to point the array. Or, for example, the results of step 502 may indicate that a line of sight and visibility of primary and secondary light sources is or will be poor, and therefore computational knowledge should be used in pointing the photovoltaic array 440. For example the position of reflective portions of a planet, such as the position of Antarctica, or the location of a storm on a planet and its effect on reflectivity, may be used to point the photovoltaic array 440. These are just some examples, and many other types of analyses may be done in step 504.

The analysis in step 502 and/or the identification in step 504 may be done by a spacecraft engineer prior to launch. In some embodiments, the steps 502 and/or 504 may be done automatically or autonomously by the control system 400. In some embodiments, the spacecraft receives commands to perform the step 502 and/or 504. In some embodiments, the step 502 and/or 504 may be performed by a separate control system or processor, such as by a different system on the spacecraft, by a computer on another spacecraft or on Earth, or by a human operator. The results of step 502 and/or 504 may then be communicated to the control system 400.

The method 500 then moves to step 506 where the photovoltaic array 440 or 120 is pointed. The photovoltaic array 440 is pointed using the method identified in step 504. The photovoltaic array 440 may be pointed using any of the methods described with respect to FIGS. 5B-5D. The photovoltaic array 440 may be pointed along the direction 138 at the angle θ as shown in FIG. 2B. The control system 400, for example the processor 410, may command the actuator 430 to rotate and/or translate to point the photovoltaic array 440.

Figure 5B:
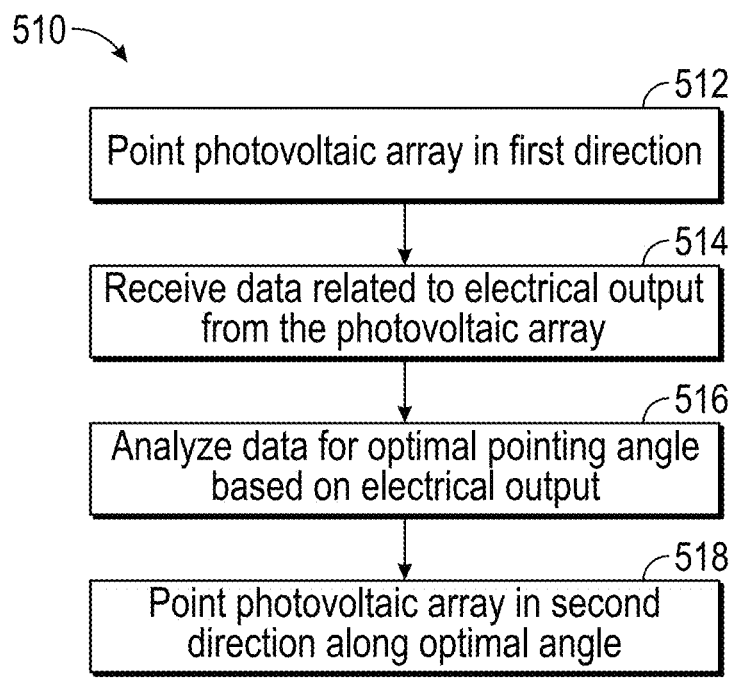
FIG. 5B is a flow chart illustrating an embodiment of a method of pointing a photovoltaic array, based on analyzing the electrical output from the photovoltaic array, and that may be used in the method of FIG. 5A.

FIG. 5B is a flow chart illustrating an embodiment of a method 510 of pointing the photovoltaic array 120 or 440 based on electrical output from the photovoltaic array 120. The method 510 may be used in the method 500 of FIG. 5A, for example in step 506. As shown in FIG. 5B, the method 510 begins with step 512 where the photovoltaic array 120 is pointed in a first direction. This may be a default direction that the photovoltaic array 120 is already pointing, or it may be a selected direction to which the photovoltaic array 120 is moved. For instance, the photovoltaic array 120 may be pointing in the direction 135 at the angle $\theta_0$ as shown in FIG. 2A, for example at the sun.

The method 510 then moves to step 514 where data related to electrical output from the photovoltaic array 120 is received. Such data may be received due to solar energy being collected by the photovoltaic array 120 and the resulting electrical power generated at that particular direction. The power data may be correlated to the angle at which the photovoltaic array 120 is pointing as the photovoltaic array 120 sweeps out a path.

The method 510 then moves to step 516 where the data collected in step 514 is analyzed. The control system 400, for example the processor 410, may analyze the relationship of angle versus electrical current or voltage generated, to determine whether the electrical output is increasing or decreasing.

The method 510 then moves to step 518 where the photovoltaic array 120 is pointed in a second direction along the optimal angle. The optimal angle is identified based on the analysis of electrical output, for example an angle where the output stops increasing and starts to decrease. This may be at the angle $\theta$ shown in the FIGS. 2B and 3.

Figure 5C:
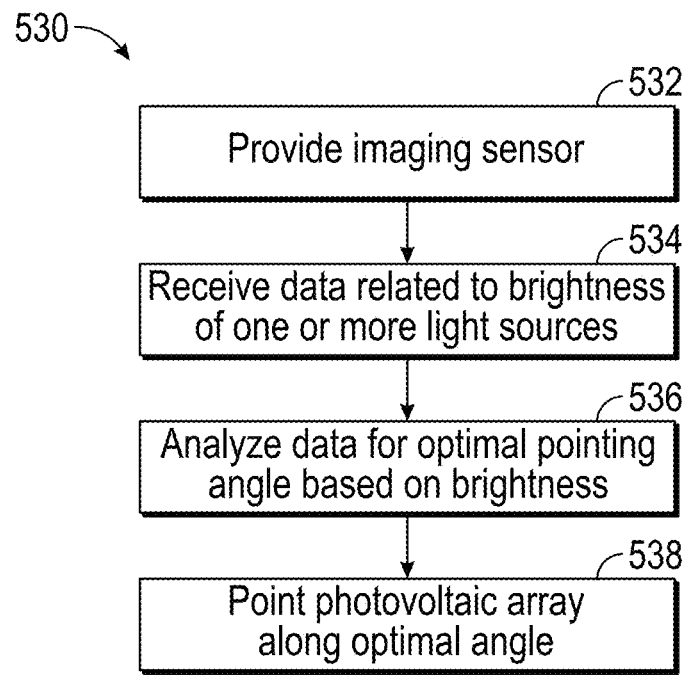
FIG. 5C is a flow chart illustrating an embodiment of a method of pointing a photovoltaic array, based on analysis of data related to one or more light sources, and that may be used in the method of FIG. 5A.

FIG. 5C is a flow chart illustrating an embodiment of a method 530 of pointing the photovoltaic array 120 or 440 based on data related to one or more light sources. The method 530 may be used in the method 500 of FIG. 5A, for example in step 506. The method 530 begins with step 532 where one or more imaging sensors are provided. The sensor may be a camera or other imaging sensor located on the spacecraft 110. The imaging sensor may be configured to receive light and/or convert it into electrical output.

The method 530 then moves to step 534 where data related to the brightness of one or more light sources is received. The data may be electrical output from the imaging sensor generated due to imaging the one or more light sources.

The method 530 then moves to step 536 where the brightness data received in step 534 is analyzed for determining the optimal pointing angle. For example, one sensor may detect relatively low brightness in a first direction and another sensor may detect a higher brightness in a second direction. The two brightness data for the two directions may be analyzed to determine an angle, such as an angle in between the two directions, at which to point the photovoltaic array 120. The method 530 then moves to step 538 where the photovoltaic array 120 is pointed along the optimal angle identified in step 536.

Figure 5D:
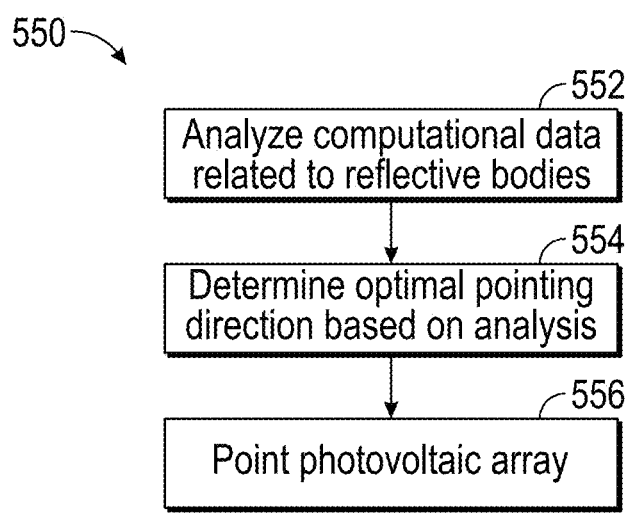
FIG. 5D is a flow chart illustrating an embodiment of a method of pointing a photovoltaic array, based on analysis of data related to computational knowledge of one or more light sources or reflective bodies, and that may be used in the method of FIG. 5A.

FIG. 5D is a flow chart illustrating an embodiment of a method 550 of pointing the photovoltaic array 120 or 440 based on data related to computational knowledge of one or more light sources or reflective bodies. The method 550 may be used in the method 500 of FIG. 5A, for example in step 506. As shown in FIG. 5D, the method 550 begins with step 552 where computational data related to reflective bodies or other light sources is analyzed. The computational data may relate to the orbital position of one or more celestial bodies and/or the sun, to the reflectivity of a reflective body, to the visibility of a reflective body, to the location of one or more other reflective spacecraft, to the weather patterns on a reflective body, and/or other data.

The method 550 then moves to step 554 where the optimal pointing angle is determined based on the analysis in step 552. For example, the control system 400, for instance the processor 410, may determine that the reflectivity of a particular body is of a certain quality, that a reflective body is or will be visible for a certain amount of time, that a spacecraft will have a particular amount of reflectivity and/or for a particular amount of time, that a particular reflective portion of a planet, such as Antarctica, will be visible, and/or that a particular weather pattern will generate an amount of reflectivity, etc. The method 550 then moves to step 556 where the photovoltaic array 120 is pointed along the optimal angle identified in step 554.

Figure 6:
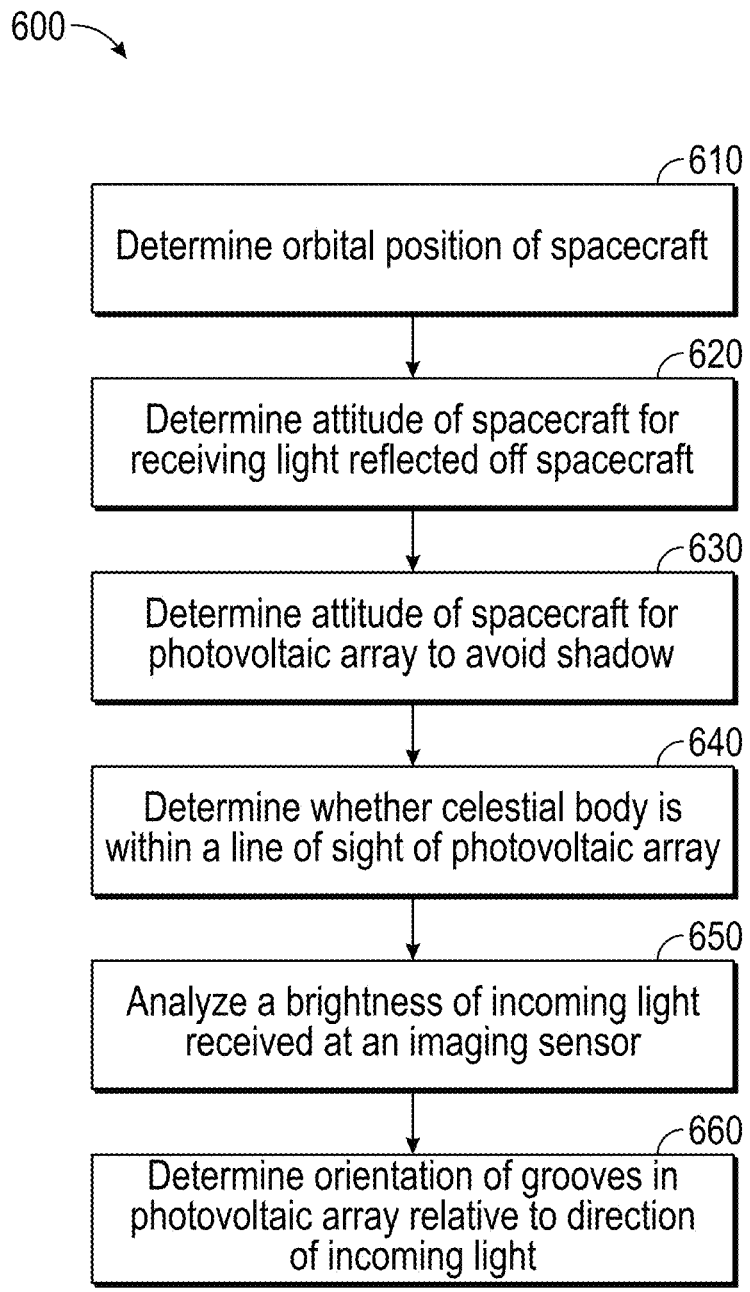
FIG. 6 is a flow chart illustrating an embodiment of a method of analyzing various solar parameters, that may be used in the method of FIG. 5A.

FIG. 6 is a flow chart illustrating an embodiment of a method 600 of analyzing various solar parameters. The method 600 may be used in the method 500 of FIG. 5A, for example in step 502. The method 600 includes various steps where various solar parameters are analyzed. Not all of the steps in method 600 may be performed, and the steps may be performed in any suitable order. Further, other solar parameters may be analyzed others than those listed herein. Any or all of the steps in the method 600 may be performed by a computer on Earth for designing or programming the control system of the spacecraft or by a control system on the spacecraft such as the control system 400.

The method 600 begins with step 610, where the orbital position of the spacecraft is determined. The computer or control system 400 may determine the orbital position of the spacecraft 110 will be or is located in a path of light reflected from a reflective body.

The method 600 then moves to step 620, where the attitude of the spacecraft 110 for receiving light reflected off the spacecraft 110 is determined. The computer or control system 400 may determine the attitude of the spacecraft 110 will be or is such that light is reflected off the spacecraft 110 in a manner such that the photovoltaic array 120 is or is not configured to be (for example, is or is not capable of being) pointed to receive the reflected light.

The method 600 then moves to step 630, where the attitude of the spacecraft 110 for the photovoltaic array 120 to avoid shadow is determined. The computer or control system 400 may determine the attitude of the spacecraft 110 will be or is such that light is incoming along a path such that the photovoltaic array 120 is or is not configured to be (for example, is or is not capable of being) pointed to receive the incoming light due to shadowing. This may be based on the geometry of the spacecraft 110 structure and/or the location of any deployable structures on the spacecraft 110.

The method 600 then moves to step 640 where it is determined whether a celestial body is within a line of sight of the photovoltaic array 120. The computer or control system 400 may determine whether the sun and/or another celestial body will be or is within a line of sight of the photovoltaic array 120.

The method 600 then moves to step 650 where the brightness of incoming light received at an imaging sensor is analyzed. The control system 400 may analyze a brightness of incoming light received at an imaging sensor on the spacecraft 110.

The method 600 then moves to step 660 where the orientation of grooves in the photovoltaic array 120 relative to the direction of incoming light is determined. The control system 400 may determine an orientation of grooves in the photovoltaic array 120 relative to a direction of incoming light. The control system 400 may determine the photovoltaic array 120 is or is not configured to be (for example, is or is not capable of being) pointed such that the grooves are parallel to the plane of incoming light. In some embodiments, the spacecraft and/or solar array may be oriented such that grooves are oriented parallel to the plane of the incoming light, as further described herein.

E. Example Photovoltaic Array Schematics for Shadow Avoidance

FIGS. 7A-7D are various views of a schematic of a spacecraft 700 in various orientations to reduce shadow on the photovoltaic arrays 710, 711. FIG. 7A is a side view of the spacecraft 700, and FIG. 7B is a cross-section view thereof as taken along the line A-A. FIG. 7B is a side view of the rotated spacecraft 700, and FIG. 7D is a cross-section view thereof as taken along the line B-B.

As shown in FIGS. 7A and 7B, the spacecraft 700 includes a spacecraft module A 720 and module B 715. A primary light source 739 and a secondary light source 731 generate light, with the photovoltaic arrays 710, 711 pointed at an optimal angle θ that is in between the two light sources 731, 739. The angle θ may be any of the optimal angles identified in the any of the methods of FIGS. 5A-6. The attitude of the spacecraft 700 and/or the orientation of the arrays 710, 711 is such that the module B 715 causes shadows 716 and 717 on the arrays 710 and 711 respectively. The shadows 716, 717 result in less than all of the incoming light being received by the arrays 710, 711, and therefore the arrays 710, 711 operate at less than optimal capacity by generating less than full electrical power. The resulting shadows and decreased incoming light may be detected and/or analyzed on a computer during design of the spacecraft or control system, and/or it may be analyzed by the spacecraft or control system on orbit.

As shown in FIGS. 7C and 7D, the spacecraft 700 and/or the photovoltaic arrays 710, 711 have been rotated 180° about an axis that is coincident with the direction of pointing, i.e. the angle θ. The result is that there is no longer any shadow on the arrays 710, 711. Such shadowing and removal of shadowing may be used in the various analyses described herein, for example the methods of FIGS. 5A-6.

F. Example Schematics of Photovoltaic Array Groove Orientation

Figure 8A:
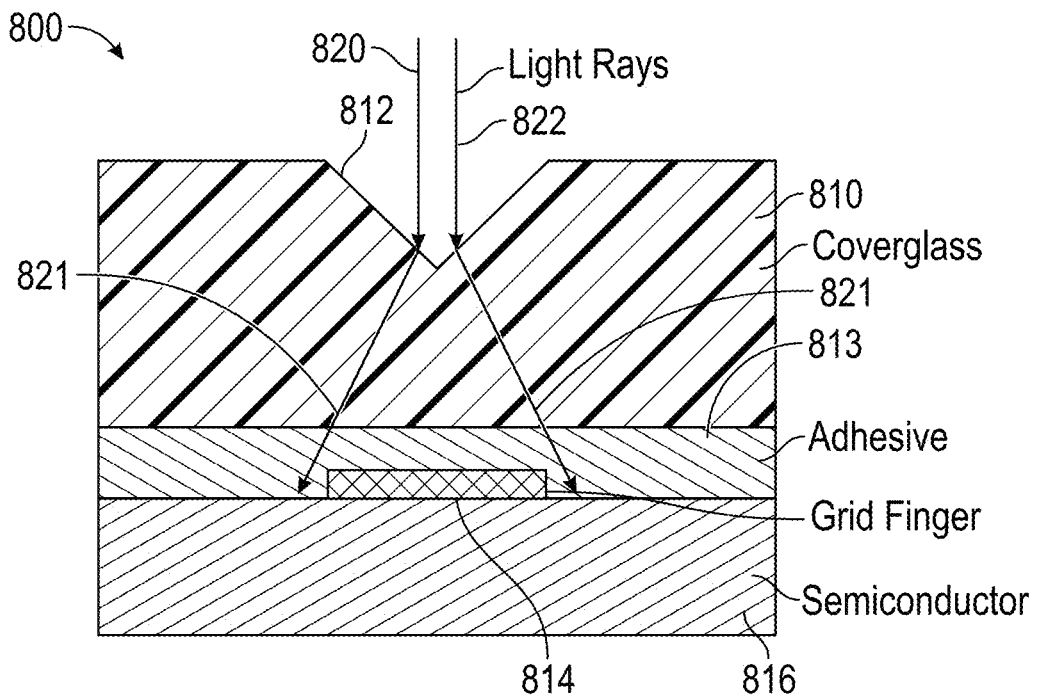
FIGS. 8A and 8B are cross-section views of schematics of a groove in a photovoltaic array, illustrating the effect of the groove on incoming light from various angles.
Figure 8B:
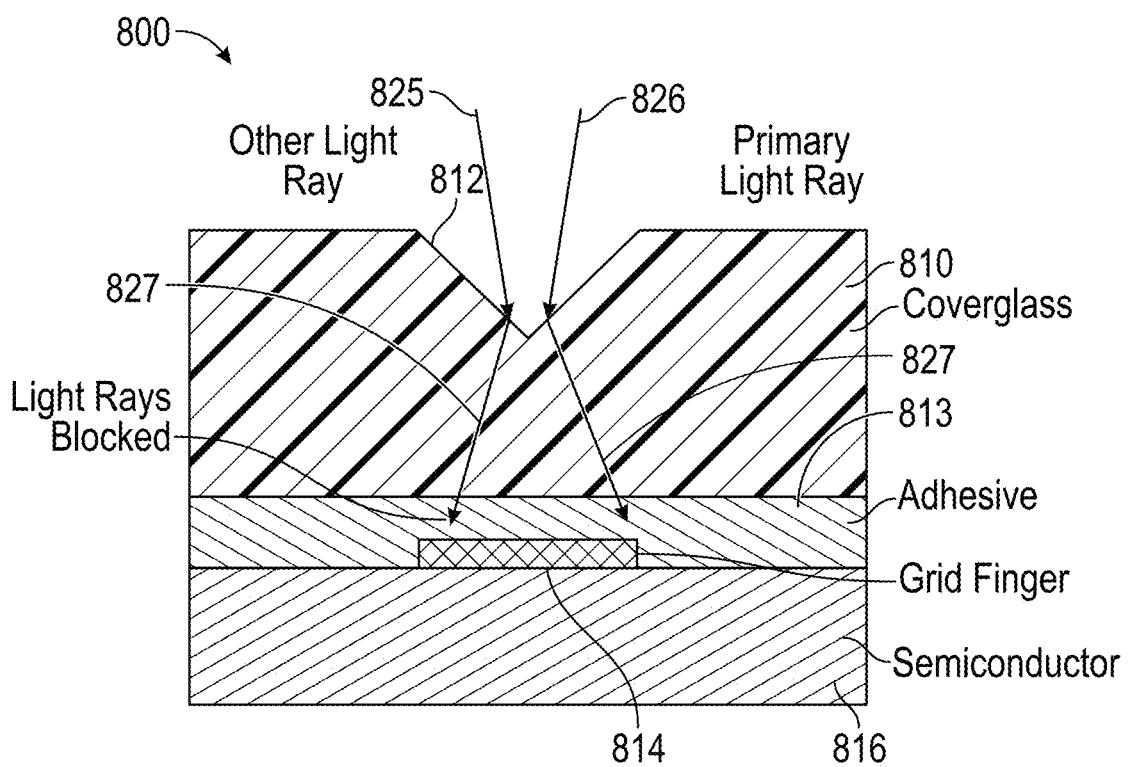

FIGS. 8A and 8B are cross-section views of schematics of a groove 812 in a photovoltaic array 800. The groove 812 may be formed in or on the surface of solar cells of the array. In some embodiments, the groove 812 may result from the manufacturing or assembly processes of the cells or array. The photovoltaic array 800 further includes a semiconductor 816 with adhesive 813 attaching a cover glass 810 on a light-facing side. A grid finger 814 is located along the semiconductor 816 and is a thin, metallic line that collects and delivers energy from the solar cell to the other components of the power subsystem. Because the grid finger 814 blocks incoming light from reaching the semiconductor material, the groove 812 refracts or re-directs light away from the grid finger 814 and onto the semiconductor 816.

The schematics illustrate the effect of the groove 812 on incoming light from various angles. As shown in FIG. 8A, incoming light rays 820, 822 are parallel to or otherwise aligned with the direction of the groove 812 (as further described with respect to FIGS. 9A-9D) and therefore refract off the groove 812 and into directions 821 onto the semiconductor. The refracted light rays are therefore converted into useable electrical energy.

However, as shown in FIG. 8B, the incoming light rays 825 and 826 are not aligned with the direction of the groove 812 (as further described with respect to FIGS. 9A-9D). The incoming light rays 825, 826 therefore refract off the groove 812 surface into directions 827 and impinge onto the grid finger 814. That incoming light is therefore not converted into usable electrical energy. Therefore, it is advantageous to have the incoming light aligned with the groove 812 as shown in FIG. 8A.

FIGS. 9A-9D are various views of a schematic of a spacecraft 900 with the photovoltaic arrays 710, 711 having grooves 912. The grooves 912 may be similar to the groove 812 described in FIGS. 8A-8B. FIG. 9A is a side view of the spacecraft 900, and FIG. 9B is a cross-section view thereof along the line C-C. FIG. 9C is a side view of the spacecraft 900 with the photovoltaic arrays 710, 711 rotated, and FIG. 9D is a cross-section view thereof along the line D-D.

As shown in the FIGS. 9A and 9B, the grooves 912 are perpendicular to the incoming light rays 825, 826. The light rays 825, 826 are from the light sources 731, 739 respectively. Further, the light rays 825, 826 depicted in FIG. 9B are shown straight for clarity, but are actually angled with respect to the plane of the page. Thus, the incoming light at each groove 912 is similar to the angle of the incoming light rays 825, 826 as shown in FIG. 8B. There is, therefore, incoming light that is not converted into electrical energy.

As shown in FIGS. 9C and 9D, the spacecraft 900 and/or photovoltaic arrays 710, 711 have been rotated about an axis that is coincident with the direction of pointing along the angle θ. Thus, the grooves 912 are now parallel to the incoming light rays 820, 822. The light rays 820, 822 are from the light sources 731, 739 respectively. Further, the light rays 820, 822 depicted in FIG. 9D are shown straight for clarity, but are actually angled with respect to the plane of the page. Thus, the incoming light at each groove 912 is similar to the angle of the incoming light rays 820, 822 as shown in FIG. 8A. The incoming light refracted by the grooves 912 is therefore converted into electrical energy.

The orienting of the grooves may be determined based on the various analyses described herein, for example the methods of FIGS. 5A-6. In some embodiments, the orientation of the grooves 812 relative to the incoming light rays 820, 822 may be analyzed. For example, the current orientation may be analyzed to determine whether and how much to rotate the solar array. As further example, while the solar array is rotating, the orientation may be analyzed to determine when to stop re-orienting the array, or whether to re-adjust the orientation. The analysis may involve analysis of the electrical output from the photovoltaic array. For example, the method 510 may be used where the array is rotated to align the grooves 812 with the incoming plane of light, and the electrical output is analyzed as described above to find the optimal orientation. Increased electrical output may correspond to an increase in the refracted light rays 821 impinging on the semiconductor 816. An optimal or maximum electrical output may correspond to an optimal orientation of the grooves 812.

Further, orienting of the grooves 812 may be used in combination with any other method described herein, such as any of the methods of FIGS. 5A-6. Thus the array may be pointed using the methods described herein, and the solar array or spacecraft may be rotated to orient the grooves as described. For example, the method 510 may be performed to determine an optimal direction in which to point the array, and the grooves 812 may be oriented as described. As further example, the method 530 may be performed to determine an optimal direction in which to point the array, and the grooves 812 may be oriented as described. As further example, the method 550 may be performed to determine an optimal direction in which to point the array, and the grooves 812 may be oriented as described.

G. Example Data Plots for Various Secondary Light Source Irradiances and Angles FIGS. 10A and 10B are data plots 1000, 1100 respectively showing example ranges of pointing angles that provide higher power generation relative to direct pointing at a primary light source for various secondary light sources, in accordance with embodiments of the present disclosure. The horizontal axis is the angular orientation of the photovoltaic array 120 or 440 relative to the primary light source in radians. The vertical axis is power expressed in dimensionless units as a ratio of the power available from pointing directly at the primary light source, which is standardized at "1.0" in this example.

In FIGS. 10A and 10B, the data line 1018 is a baseline reference and represents the power available when the photovoltaic array 120 is pointed directly at the primary light source. The data lines 1010, 1012, 1014, and 1016 show the combined power available from the primary and secondary light sources, where the secondary light sources are represented by the data lines 1008, 1006, 1004, and 1002, respectively. For instance, when the secondary light source is represented by data line 1008, the corresponding combined power output is shown by data line 1010, etc.

FIG. 10A shows the power generation for various levels of irradiance level of the secondary light source. As shown in FIG. 10A, the data lines 1008, 1006, 1004, 1002 correspond to a secondary light source having an irradiance of about 0.4, 0.3, 0.2 and 0.1, respectively. For example, the data line 1008 has the highest irradiance, and so the corresponding data line 1010 produces the greatest power, etc.

In the example of FIG. 10A, the secondary light source is angled at 0.8 radians (45.8°) from the primary light source. When the secondary light source has 0.4 irradiance, the power gain, $\Delta P_1$, is about 2.7% higher than for pointing the photovoltaic array 120 straight at the primary light source. The peak power occurs at roughly 0.23 radians (13°) from the primary light source.

Further, FIG. 10A shows that there is a range of angles at which the combined power is higher than just pointing directly at the primary light source. For example, for a secondary light source with 0.4 irradiance shown by data line 1008, the power gain is positive from just above 0 radians to about 0.42 radians (24°) as shown by data line 1010. As another example, for a secondary light source with 0.2 irradiance shown by data line 1004, the power gain $\Delta P_2$ is positive from just above 0 radians to about 0.25 radians (14°) as shown by the data line 1014. Thus the photovoltaic array 120 may be pointed at a range of angles and still produce more power relative to direct pointing at the primary light source.

FIG. 10B shows the power generation for various angles of incidence of a secondary light source. The data lines 1008, 1006, 1004, 1002 correspond to secondary light sources that each emit 0.4 units of irradiance but are at different angles relative to the primary light source. The position of the secondary light source is at 0.2, 0.4, 0.6 and 0.8 radians from the primary light source, corresponding to the data lines 1002, 1004, 1006, and 1008 respectively. Total photovoltaic power from the two sources combined is shown by the data lines 1016, 1014, 1012, and 1010, as described. Maximum power is attained at the peak of each curve. For example, when the secondary light source is at 0.8 radians (45.8°) as shown by the data line 1008, the power gain, $\Delta P_2$, is 2.7% higher than for pointing the PV array straight at the primary light source, as depicted by combined power data line 1010. The peak power occurs at roughly 0.23 radians (13°) from the primary light source.

Further, FIG. 10B shows that there is a range of angles at which the combined power is higher than just pointing directly at the primary light source. For example, for a secondary light source at 0.8 radians (45.8°) as shown by the data line 1008, the power gain $\Delta P_2$ is positive from just above 0 radians to about 0.42 radians (24°) as shown by the data line 1010. As another example, for a secondary light source at 0.4 radians (22.9°) as shown by the data line 1004, the power gain $\Delta P_1$ is positive from just above 0 radians to about 0.24 radians (14°) as shown by the data line 1014.

H. Terminology

The terminology used in the description presented herein is not intended to be interpreted in any limited or restrictive manner, simply because it is being utilized in conjunction with a detailed description of certain specific embodiments of the development. While the above detailed description has shown, described, and pointed out novel features of the present disclosure as applied to various embodiments, it will be understood that various omissions, substitutions, and changes in the form and details of the device or process illustrated may be made by those skilled in the art without departing from the spirit of the present disclosure. As will be recognized, the present disclosure may be embodied within a form that does not provide all of the features and benefits set forth herein, as some features may be used or practiced separately from others. All changes which come within the meaning and range of equivalency of the claims are to be embraced within their scope.

The flow chart sequences are illustrative only. A person of skill in the art will understand that the steps, decisions, and processes embodied in the flowcharts described herein may be performed in an order other than that described herein. Thus, the particular flowcharts and descriptions are not intended to limit the associated processes to being performed in the specific order described.

The term "comprising" as used herein is synonymous with "including," "containing," or "characterized by," and is inclusive or open-ended and does not exclude additional, unrecited elements or method steps. With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches. For example, terms such as about, approximately, substantially, and the like may represent a percentage relative deviation, in various embodiments, of ±1%, ±5%, ±10%, or ±20%.

The above description discloses several methods and materials of the present disclosure. The present disclosure is susceptible to modifications in the methods and materials, as well as alterations in the fabrication methods and equipment. Such modifications will become apparent to those skilled in the art from a consideration of this disclosure. Consequently, it is not intended that the present disclosure be limited to the specific embodiments disclosed herein, but that it covers all modifications and alternatives coming within the true scope and spirit of the present disclosure.

What is claimed is:

1. A control system for pointing a photovoltaic array on a spacecraft, the control system comprising:
   a processor; and
   a memory storing instructions thereon that, when executed by the processor, cause the control system to:
   point the photovoltaic array using one or more methods of a plurality of methods for pointing the photovoltaic array, wherein the plurality of methods includes a first method comprising analyzing first data related to electrical output from the photovoltaic array, a second method comprising analyzing second data related to one or more light sources, and a third method comprising analyzing third data related to computational knowledge of one or more reflective bodies; and,
   orient the photovoltaic array such that grooves of solar cells of the photovoltaic array are parallel to a plane of incoming light.

2. The control system of claim 1, wherein the instructions further cause the control system to orient the photovoltaic array based on analysis of electrical output of the photovoltaic array.

3. The control system of claim 1, wherein the instructions further cause the control system to orient the photovoltaic array based on analysis of brightness of the one or more light sources.

4. The control system of claim 1, wherein the instructions further cause the control system to orient the photovoltaic array based on analysis of locations of one or more light sources.

5. The control system of claim 1, wherein the instructions further cause the control system to determine an orbital position of the spacecraft is located in a path of light reflected from a reflective body.

6. The control system of claim 1, wherein the instructions further cause the control system to determine the attitude of the spacecraft is such that light is being reflected off the spacecraft in a manner such that the photovoltaic array is configured to be pointed to receive the reflected light.

7. The control system of claim 1, wherein the instructions further cause the control system to determine the attitude of the spacecraft is such that light is incoming along a path such that the photovoltaic array is not pointed to receive all of the incoming light as a result of shadowing.

8. The control system of claim 1, wherein the instructions further cause the control system to determine whether a sun and/or another celestial body is within a line of sight of the photovoltaic array.

9. The control system of claim 1, wherein the instructions further cause the control system to analyze a brightness of incoming light received at an imaging sensor on the spacecraft.

10. The control system of claim 1, wherein the instructions further cause the control system to point the photovoltaic array in between a sun and a reflective celestial body using the first method, wherein the first data comprises electrical power output from the photovoltaic array based on angle of pointing the array.

11. The control system of claim 1, wherein the instructions further cause the control system to point the photovoltaic array in between a sun and a reflective celestial body using the second method, wherein the second data comprises brightness of the one or more light sources.

12. The control system of claim 1, wherein the instructions further cause the control system to point the photovoltaic array in between a sun and a reflective celestial body using the third method, wherein the third data comprises locations of one or more light sources.

13. The control system of claim 1, further comprising a light sensor and/or an imaging sensor.

14. A spacecraft comprising:
a photovoltaic array; and
a control system for pointing the photovoltaic array, the control system comprising:
a processor; and
a memory storing instructions thereon that, when executed by the processor, cause the control system to:
point the photovoltaic array using one or more methods of a plurality of methods for pointing the photovoltaic array, wherein the plurality of methods includes a first method comprising analyzing first data related to electrical output from the photovoltaic array, a second method comprising analyzing second data related to one or more light sources, and a third method comprising analyzing third data related to computational knowledge of one or more reflective bodies; and
orient the photovoltaic array such that grooves of solar cells of the photovoltaic array are parallel to a plane of incoming light.

15. The spacecraft of claim 14, wherein the instructions further cause the control system to orient the photovoltaic array based on analysis of electrical output of the photovoltaic array.

16. The spacecraft of claim 14, wherein the instructions further cause the control system to orient the photovoltaic array based on analysis of brightness of the one or more light sources.

17. The spacecraft of claim 14, wherein the instructions further cause the control system to orient the photovoltaic array based on analysis of locations of one or more light sources.

18. The spacecraft of claim 14, wherein the instructions further cause the control system to do one or more of the following:
determine the orbital position of the spacecraft is located in a path of light reflected from a reflective body,
determine the attitude of the spacecraft is such that light is being reflected off the spacecraft in a manner such that the photovoltaic array is configured to be pointed to receive the reflected light,
determine the attitude of the spacecraft is such that light is incoming along a path such that the photovoltaic array is not pointed to receive all of the incoming light as a result of shadowing,
determine whether the sun and/or another celestial body is within a line of sight of the photovoltaic array, and
analyze a brightness of incoming light received at an imaging sensor on the spacecraft.

19. The spacecraft of claim 14, wherein the instructions further cause the control system to point the photovoltaic array in between a sun and a reflective celestial body using the first method, wherein the first data comprises electrical power output from the photovoltaic array based on angle of pointing the array.

20. The spacecraft of claim 14, wherein the instructions further cause the control system to point the photovoltaic array in between a sun and a reflective celestial body using the second method, wherein the second data comprises brightness of the one or more light sources.

21. The spacecraft of claim 14, wherein the instructions further cause the control system to point the photovoltaic array in between a sun and a reflective celestial body using the third method, wherein the third data comprises locations of one or more light sources.

22. The spacecraft of claim 14, further comprising a light sensor and/or an imaging sensor.

23. A method for pointing a photovoltaic array on a spacecraft, the method comprising:
pointing the photovoltaic array using one or more methods of a plurality of methods for pointing the photovoltaic array, wherein the plurality of methods includes a first method comprising analyzing first data related to electrical output from the photovoltaic array, a second method comprising analyzing second data related to one or more light sources, and a third method comprising analyzing third data related to computational knowledge of one or more reflective bodies; and
orienting the photovoltaic array such that grooves of solar cells of the photovoltaic array are parallel to a plane of incoming light.

24. The method of claim 23, further comprising:
analyzing electrical output of the photovoltaic array; and
orienting the photovoltaic array based on analyzing the electrical output of the photovoltaic array.

25. The method of claim 23, further comprising:
analyzing brightness of the one or more light sources; and
orienting the photovoltaic array based on analyzing the brightness of the one or more light sources.

26. The method of claim 23, further comprising:
analyzing locations of one or more light sources; and
orienting the photovoltaic array based on analyzing the locations of the one or more light sources.

27. The method of claim 23, further comprising pointing the photovoltaic array in between a sun and a reflective celestial body using the first method, wherein the first data comprises electrical power output from the photovoltaic array based on angle of pointing the array.

28. The method of claim 23, further comprising pointing the photovoltaic array in between a sun and a reflective celestial body using the second method, wherein the second data comprises brightness of the one or more light sources.

29. The method of claim 23, further comprising pointing the photovoltaic array in between a sun and a reflective celestial body using the third method, wherein the third data comprises locations of one or more light sources.

30. The method of claim 23, further comprising one or more of the following:
determining the orbital position of the spacecraft is located in a path of light reflected from a reflective body,
determining the attitude of the spacecraft is such that light is being reflected off the spacecraft in a manner such that the photovoltaic array is configured to be pointed to receive the reflected light,
determining the attitude of the spacecraft is such that light is incoming along a path such that the photovoltaic array is not pointed to receive all of the incoming light as a result of shadowing,
determining whether the sun and/or another celestial body is within a line of sight of the photovoltaic array, and
analyzing a brightness of incoming light received at an imaging sensor on the spacecraft.

* * * * *

UNITED STATES PATENT AND TRADEMARK OFFICE
CERTIFICATE OF CORRECTION

| | | |
|---|---|---|
| PATENT NO. | : 12,157,585 B2 | Page 1 of 1 |
| APPLICATION NO. | : 17/560798 | |
| DATED | : December 3, 2024 | |
| INVENTOR(S) | : Brian Jay Tillotson | |

It is certified that error appears in the above-identified patent and that said Letters Patent is hereby corrected as shown below:

In the Specification

Column 7, Line 30 delete "small 6, where sin(0)~ 6, the" and insert -- small $\theta$, where $\sin(\theta) \sim \theta$, the --.

Signed and Sealed this
Thirteenth Day of May, 2025

Coke Morgan Stewart
*Acting Director of the United States Patent and Trademark Office*